(12) United States Patent
Garrett

(10) Patent No.: US 7,683,693 B2
(45) Date of Patent: Mar. 23, 2010

(54) HOT SWAP CONTROLLER WITH ZERO LOADED CHARGE PUMP

(75) Inventor: James Garrett, Nashua, NH (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/132,267

(22) Filed: Jun. 3, 2008

(65) Prior Publication Data

US 2009/0256616 A1  Oct. 15, 2009

Related U.S. Application Data

(60) Provisional application No. 61/043,920, filed on Apr. 10, 2008.

(51) Int. Cl.
*H03K 5/08* (2006.01)
(52) U.S. Cl. .................................. 327/309; 327/536
(58) Field of Classification Search ................ 327/309, 327/108, 306, 321, 534–537
See application file for complete search history.

(56) References Cited

U.S. PATENT DOCUMENTS

| | | | |
|---|---|---|---|
| 5,079,456 A | 1/1992 | Kotowski et al. | |
| 6,137,165 A | 10/2000 | Thierry | |
| 6,188,210 B1 * | 2/2001 | Tichauer et al. | 323/273 |
| 6,275,395 B1 | 8/2001 | Inn et al. | |
| 6,304,108 B1 | 10/2001 | Inn | |
| 6,400,203 B1 | 6/2002 | Bezzi et al. | |
| 6,949,961 B2 * | 9/2005 | Robb et al. | 327/52 |
| 7,049,796 B2 * | 5/2006 | Cherniski et al. | 323/271 |
| 2007/0247765 A1 | 10/2007 | Takahashi et al. | |

OTHER PUBLICATIONS

"Notification of Transmittal of the International Search Report and the Written Opinion of the International Searching Authority, or the Declaration", International Application No. PCT/US2009/002140, mailed on Aug. 7, 2009, 14 pages.

* cited by examiner

*Primary Examiner*—Dinh Le
(74) *Attorney, Agent, or Firm*—Cesari and McKenna, LLP; Edwin H. Paul, Esq.

(57) ABSTRACT

The present invention includes a pass transistor that limits current drawn from a circuit without using a series resistor and while drawing minimal current from an external supply. A current mirror of the output current is formed and compared to a reference current. When the output current increases, the mirror current increases proportionally, and when a threshold is crossed, the pass transistor is turned off. The pass transistor is biased from a charge pump that provides a voltage, a current from which a current mirror is drawn that controls the pass transistor.

8 Claims, 1 Drawing Sheet

HOT SWAP CONTROLLER WITH ZERO LOADED CHARGE PUMP

RELATED APPLICATIONS

The present application is related to and claims the benefit of the filing date of a provisional application Ser. No. 61/043,920, filed Apr. 10, 2008, and of common title, inventorship and ownership as the present application. The provisional application is incorporated herein by reference.

This application is also related to another application, entitled "Technique for Combining Inrush Current Limiting and Short Circuit Current Limiting," filed on Jun. 3, 2008 and assigned Ser. No. 12/132,286 which is of common inventorship and ownership as the present application, and which application is incorporated herein by reference.

BACKGROUND OF THE INVENTION

1. Field of the Invention

The present invention relates to "hot swapping" controllers and more particularly for hot swapping while drawing about zero current from an onboard charge pump. "Hot swapping" refers to inserting and removing a circuit into or out of a computer system, without removing or powering down the system.

2. Background Information

In the past, power was disconnected while plugging and unplugging circuits into computer or other such electronic systems. This was necessary since the random making and breaking of contacts as a circuit board or module was being inserted or removed from a connector could harm the circuits and/or the system. The possible mis-connections to power, ground and signal inputs and outputs were not controlled.

However, the need to disconnect and later re-connect power is onerous, especially where entire systems may have to be powered down, possibly in set sequences, and later powering up, possibly in set sequences, and re-establishing conditions may take too much time. Moreover, any errors in powering down or up could create high currents and power glitches that may harm the circuits.

Today, it is common to plug and unplug and plug circuits, memories, controllers, etc., into electronic systems without removing power. However, these hot swapping circuits take up valuable space in such systems and often must be located externally with respect to the system they are protecting.

U.S. Pat. No. 6,400,203 to Bezzi et al. ((Bezzi), entitled "Hot Swap Current Limit Circuits and Methods," is directed to current limiting circuits that may be "hot swapped." Bezzi, in his FIG. 1, illustrates an example of his invention using a sense resistor, Rsense. This sense resistor is in series with the load current and the voltage across the sense resistor is used to control the load current involved. The use of a series sense resistor limits the voltage dynamic range of the circuit during normal operations, dissipates power and increases the impedance of the circuit.

Another U.S. Pat. No. 6,275,395 to Inn et al. (Inn), entitled "Accelerated Turn-off of MOS Transistors by Bootstrapping," describes another current limiting circuit. This circuit also uses a sense resistor in series with the load current. It suffers from similar limitations as does the Bezzi patent.

Prior art circuits consume too much die area and power while exhibiting a high "on" impedance (RDSon) of a pass FET and the series sense resistor.

SUMMARY OF THE INVENTION

The present invention provides an output current limiting circuit that includes a small charge pump that saves on die area and design time. Since, the current from the charge pump is small, a higher charge pump voltage may be used which translates to a lower RDSon (an "on" FET resistance) for the same die area of a pass FET. In addition, an accurate current sense scheme is implemented that preserves load current limiting accuracy, saves current from the charge pump; and does not use a series sense resistor—which preserves circuit dynamic range and does not increase circuit "on" (RDSon) impedance.

In one embodiment, the present invention, compared to prior art, draws less current from Vcc, has a lower RDSon impedance uses higher voltages, and lower currents that consume less die area and are simpler designs.

Illustratively, a current mirror of the output current is formed and compared to a reference current. When output current, that travels through a pass transistor, increases, the mirrored current increases. When the mirror current becomes higher than the reference current the circuit turns off the pass transistor.

In one embodiment, a charge pump, CP, is used that outputs a voltage Vcp from which a current Idc is drawn. Idc is mirrored in Iddc that drives the control terminal of the pass transistor. When the pass transistor is a FET, Iddc charges the stray capacitance associated with the GATE up to Vcp wherein Iddc shuts off. At that point, the only load on Vcp is the current source Idc, and that current that may be made as small as leakage and noise permits.

Illustratively, the current limiting circuit includes a pass transistor connected between an input and an output. The pass transistor drain is connected to the input and its source to the output. A sense transistor is placed in parallel with the pass transistor sharing common drain and gate connections. A charge pump supplies a voltage Vcp from which a current, Idc, is drawn. Idc is mirrored by Iddc that drives the gate connections to turn on both the pass and sense transistors.

An operational amplifier has its inputs connected to the pass transistor source and the sense transistor source output to maintain the voltages at both points equal to each other. In this manner the current in the sense transistor is a mirror of the output current.

A reference current is formed and a comparator compares the mirror current to the reference current and generates a signal indicating which current is higher. Illustratively, another mirror circuit may be used advantageously.

When the mirror current exceeds the reference current, the comparator turns on a control transistor that drives the gate connections turning off the pass and the sense transistors.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
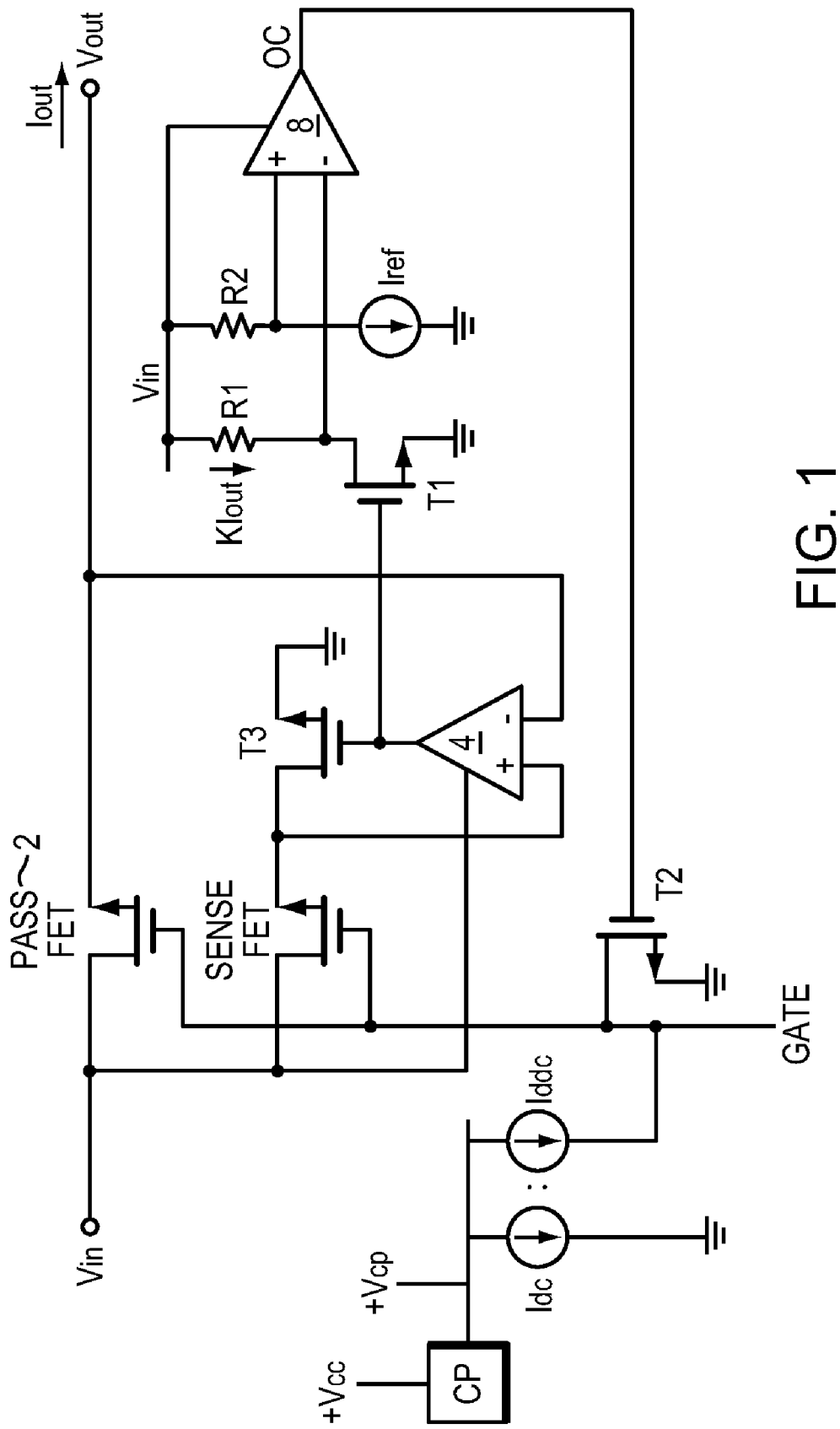
FIG. 1 is a schematic block diagram embodying an example of the invention.

FIG. 1 illustrates one embodiment of the present invention. Here a pass FET 2 is placed between Vin and Vout and controls the Iout current provided to downstream electronics (not shown).

Vin, rather than Vcp, powers an accurate current sense circuit that indirectly senses current through the pass FET 2 and limits that current when a designed limit is reached. During normal operations, virtually no current is taken from Vcp as described below.

During typical operation, when there is no over current condition, and as mentioned above, a charge pump CP provides a voltage Vcp from which a current Idc is drawn. That current is mirrored producing Iddc that drives the capacitance (not shown) associated with the GATE. The GATE is driven up to near Vcp, whereupon it ceases to act as a current source. The current source Idc will continue to operate drawing current from Vcp, but Idc can be made small consistent with noise and leakage.

Still considering typical operation, the Gate signal is high turning on the pass FET 2 and the sense FET. The drains of both of these transistors are connected to Vin. An operational amplifier 4 is powered from Vin with its inverting input tied to Vout at the source of the pass FET 2, and the non-inverting input is tied to the source of the sense FET. The operational amplifier 4 will maintain the voltage difference at its inputs to be near equal, so that the pass FET 2 and the sense FET are current mirrors. The sense FET source current is a mirror of Iout. As known to those skilled in the art, current mirrors may have equal currents, they may be designed as proportional to each other.

The operational amplifier is part of a negative feedback condition that will maintain the voltage difference at its inputs to be near zero. The operational amplifier's output drives the gate of FET T3 which sinks current from the source of the sense FET.

If, for example, T3 were off, the source current from the sense FET would drive the non-inverting input of the operational amplifier 4 higher until T3 turns on. If T3 were on driving its drain to ground, the Vout will driving the inverting input of the operational amplifier higher than the non-inverting input and cause the operational amplifier output to go higher turning on T3. In this manner the voltage difference across the operational amplifier inputs will be near zero.

Still in the typical operation, the output of the operational amplifier 4 also drives the gate of T1, where T1 and T3 form another current mirror. In this case the drain current of T1 is KIout or a proportional mirror of Iout (K being a proportion factor). A reference current Iref draws current from Vin via R2, and KIout draws current from Vin via R1. As seen in FIG. 1, an input from R1 is fed to the inverting input of a comparator 8. An input from R2 is fed to the non-inverting input of the comparator 8. In typical operation, the inverting input to the comparator 8 is higher than the non-inverting input and the output of the comparator 8, OC, is low keeping T2 off.

The circuit of FIG. 1 is designed to sense when the current through the pass FET 2 is too high and in response turn off the pass FET 2. When Iout increases, Vout drops turning on T3 and T1 harder. KIout increases (a mirror of Iout) and the voltage at the inverting input of the comparator 8 decreases. When that decrease passes the voltage on the non-inverting input, the output OC is driven high turning on T2, which in turn turns off the pass FET 2 and the sense FET.

It should be understood that above-described embodiments are being presented herein as examples and that many variations and alternatives thereof are possible. Accordingly, the present invention should be viewed broadly as being defined only as set forth in the hereinafter appended claims.

The invention claimed is:

1. A circuit that limits currents comprising:
   a pass transistor having a first input, a first output and a first control, wherein the input is connected to an input voltage, the first output delivers an output current to a load;
   a sense transistor having a second input, a second output and a second control, wherein the second input is connected the first input, and the second control is connected to the first control, the second output delivers a first mirror current of the first output current to the load;
   a charge pump that powers a current source that drives the first and the second controls high which, in turn, turns on the pass and the sense transistors;
   a current mirror circuit that accepts the first mirror current and produces a second mirror current thereof;
   a comparator that compares the second mirror current to a reference current derived from the input voltage and generates a signal indicating which current is higher;
   a control transistor that receives the signal from the comparator, and, when the second mirror current exceeds the reference current, turns on the control transistor, wherein the control transistor drives the first and the second controls turning off the pass and the sense transistors.

2. The circuit of claim 1 wherein the input voltage powers the circuit except that the first and second controls are powered from another power source.

3. The circuit of claim 1 wherein the current source powered by the charge pump comprises:
   a current mirror, having a mirrored current output that drives the controls of the pass and sense transistors.

4. The circuit of claim 1 wherein the current mirror circuit that forms a mirror current of the output current comprises:
   an operational amplifier with one input connected to the first output, its second input connected to the second output, its output connected to a sink transistor that accepts the current from the second output, wherein the operational amplifier maintains the first output equal to the second output by controlling the sink transistor with the operational amplifier's output, wherein the current from the second output to the sink transistor is a mirror of the output current;
   a mirror current of the sinked current, that also mirrors the output current;
   a reference current; wherein the comparator compares the reference current and the mirror current.

5. The circuit of claim 1 wherein all the transistors are N-type FETs.

6. A circuit that limits currents comprising:
   pass transistor having a first input, a first output and a first control, wherein the first input is connected to an input voltage and the first output delivers an output current to a load;
   a current mirror circuit that forms a mirror current of the output current;
   a comparator that compares the mirror current to a reference current derived from the input voltage and generates a signal indicating which current is higher than the other;

a control transistor, controlled by the signal, that is connected to the first control; wherein when the mirror current exceeds the reference current the comparator turns off the pass transistor.

7. A process for limiting an output current, the process comprising the steps of:

passing the output current through a pass transistor from an input voltage;

mirroring the output current to produce a mirror current;

comparing the mirror current to a reference current derived from the input voltage and generating a signal indicating which current is higher; and in response the comparing, controlling a control transistor coupled to the gate of the pass transistor, wherein, when the mirror current exceeds the reference current, outputting a signal from the control transistor that turns off the pass transistor.

8. The process of claim 7 further comprising the steps of:

turning on the pass transistor from a second current mirror, wherein the turning on includes no DC current; and powering the output current mirror and the circuitry performing the comparing from an input voltage; and powering the second current mirror from a separate power source.

* * * * *